US008426272B2

(12) United States Patent
Yoon et al.

(10) Patent No.: US 8,426,272 B2
(45) Date of Patent: Apr. 23, 2013

(54) NON-VOLATILE MEMORY DEVICES INCLUDING SHARED BIT LINES AND METHODS OF FABRICATING THE SAME

(75) Inventors: Young-bae Yoon, Yongin-si (KR); Jeong-dong Choe, Anyang-si (KR); Hee-soo Kang, Seoul (KR); Dong-hoon Jang, Seoul (KR); Ki-hyun Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/545,711

(22) Filed: Jul. 10, 2012

(65) Prior Publication Data

US 2012/0276729 A1    Nov. 1, 2012

Related U.S. Application Data

(63) Continuation of application No. 12/453,961, filed on May 28, 2009.

(30) Foreign Application Priority Data

Jun. 5, 2008    (KR) .................. 10-2008-0053212
Jun. 17, 2008   (KR) .................. 10-2008-0057021

(51) Int. Cl.
*H01L 21/8247*    (2006.01)
(52) U.S. Cl.
USPC ............... 438/257; 438/296; 257/E21.179; 257/E21.422; 257/E21.68
(58) Field of Classification Search .......... 438/218–228, 438/257–267, 294–298; 257/E21.422, E21.179, 257/E21.68
See application file for complete search history.

(56) References Cited

U.S. PATENT DOCUMENTS

| | | | |
|---|---|---|---|
| 4,962,481 A | 10/1990 | Choi et al. | |
| 5,328,810 A * | 7/1994 | Lowrey et al. | 430/313 |
| 5,332,917 A | 7/1994 | Lee et al. | |
| 5,923,606 A | 7/1999 | Lee et al. | |
| 5,969,990 A | 10/1999 | Arase | |
| 6,582,860 B2 | 6/2003 | Lee et al. | |
| 6,720,612 B2 | 4/2004 | Takeuchi et al. | |
| 7,067,871 B2 * | 6/2006 | Ozawa | 257/315 |
| 7,227,781 B2 | 6/2007 | Iizuka | |

(Continued)

FOREIGN PATENT DOCUMENTS

| | | |
|---|---|---|
| JP | 06-275800 | 9/1994 |
| JP | 2004-134702 | 4/2004 |

*Primary Examiner* — Steven J Fulk
*Assistant Examiner* — Eric Ward
(74) *Attorney, Agent, or Firm* — Harness, Dickey & Pierce, P.L.C.

(57) ABSTRACT

Provided are non-volatile memory devices and methods of fabricating the same, including improved bit line and contact formation that may reduce resistance and parasitic capacitance, thereby reducing manufacturing costs and improving device performance. The non-volatile memory devices may include a substrate; a plurality of field regions formed on the substrate, each of the field regions including a homogeneous first field and a second field that is divided into two sub regions via a bridge region; an active region formed on the substrate and defined as having a string structure by the field regions, where at least two strings may be connected via one of the bridge regions; and a plurality of shared bit lines may be formed on the field regions and connected to the active region via bit line contacts, where the bit line contacts may be direct contacts.

15 Claims, 20 Drawing Sheets

U.S. PATENT DOCUMENTS

| | | |
|---|---|---|
| 7,433,231 B2 | 10/2008 | Aritome |
| 7,528,452 B2 | 5/2009 | Sugimae et al. |
| 7,638,878 B2 | 12/2009 | Aritome |
| 7,759,197 B2 * | 7/2010 | Tran .................. 438/267 |
| 7,829,262 B2 * | 11/2010 | Tran .................. 430/311 |
| 2005/0136601 A1 * | 6/2005 | Jang et al. ............ 438/296 |
| 2006/0124988 A1 * | 6/2006 | Hur et al. ............. 257/315 |
| 2006/0186485 A1 | 8/2006 | Cho et al. |
| 2006/0245233 A1 | 11/2006 | Mikolajick et al. |
| 2007/0075336 A1 * | 4/2007 | Sel et al. ............. 257/202 |
| 2007/0122968 A1 | 5/2007 | Sim et al. |
| 2007/0126028 A1 | 6/2007 | Higashitani |
| 2007/0285983 A1 * | 12/2007 | Ishii et al. ........... 365/185.13 |
| 2008/0285344 A1 * | 11/2008 | Ruttkowski et al. ..... 365/185.05 |
| 2009/0086547 A1 | 4/2009 | Tang |
| 2009/0278173 A1 | 11/2009 | Fang et al. |

* cited by examiner

NON-VOLATILE MEMORY DEVICES INCLUDING SHARED BIT LINES AND METHODS OF FABRICATING THE SAME

PRIORITY STATEMENT

This application is a continuation under 35 U.S.C. §120 of U.S. application Ser. No. 12/453,961, filed May 28, 2009, which claims priority under 35 U.S.C. §119 to Korean Application Nos. 10-2008-0053212 and 10-2008-0057021, filed on Jun. 5, 2008 and Jun. 17, 2008, respectively, in the Korean Intellectual Property Office (KIPO), the entire contents of each of which are incorporated herein by reference.

BACKGROUND

1. Field

Example embodiments relate to semiconductor memory devices and methods of fabricating the same, and more particularly, to non-volatile memory devices with improved integration density and methods of fabricating the same.

2. Description of the Related Art

Flash memory devices are non-volatile memory devices that can be electrically programmed and erased. Flash memory devices may have good portability and impact resistance characteristics. There is a growing demand for flash memory devices to be used in portable information devices, such as portable personal computers (PCs) or mobile phones. For this reason, research has been directed towards increasing integration density of memory devices in order to enable the production of increased capacity memory devices. In order to enable increase integration density, flash memory devices were introduced that include 16 or 32 memory cells connected in series to form a string.

As device pitch is reduced in highly integrated flash memory devices, it becomes increasingly difficult to form a contact between an active string and a bit line. The alignment process must be performed very accurately and a defect (e.g., a short circuit) is likely to occur between adjacent bit lines even after forming the contact. A double patterning technology (DPT) process may be performed in order to form bit lines that are accurately aligned in a one to one relationship with an active string within a very small device pitch. However, this process may be difficult to perform.

Furthermore, a reduction of device pitch results in a reduction of the interval between bit lines. A reduction of the interval between bit lines results in an increase in parasitic capacitance because the capacitance is proportional to the surface area of each of the bit lines and is inversely proportional to the distance between the bit lines. When parasitic capacitance $C_{BL-to-BL}$ increases between bit lines the performance of a memory device is degraded. For example, increases or decreases in a read time $t_{read}$ of a memory are directly proportional to increases or decreases in resistance and/or capacitance. Accordingly, methods of preventing parasitic capacitance from increasing due to a reduction in a bit line interval caused by a reduction in device pitch and methods of reducing resistance between a bit line contact and an active region may be desirable.

SUMMARY

Example embodiments provide non-volatile memory devices which may be fabricated using simplified bit line and bit line contact fabrication processes while preventing or reducing increases in parasitic capacitance, thereby reducing manufacturing costs and improving the performance of the devices and methods of fabricating the same.

According to example embodiments, there are provided non-volatile memory devices having shared bit lines. The devices may include a substrate, a field region on the substrate including a first field and a second field, the second field divided into sub regions via a bridge region, and a plurality of strings in the active region, the plurality of strings defined by the field region, with at least two of the strings connected via the active region in the bridge region. The non-volatile memory device may include a bit line on the field region, a bit line contact that is a direct contact in the bridge region connecting the at least two strings to the bit line, and a plurality of word lines perpendicular to the field region and crossing above the active region and the field region. A tunneling oxide may be on the active region. The field region may include an oxide layer and the oxide of the field region may be on the active region in each bridge region. The bit line contact may include a barrier metal and a conductive material. The bit lines may be copper. The barrier metal may be either silicon nitride spacer/titanium/titanium nitride or titanium/titanium nitride. The conductive material may be either tungsten or polysilicon.

The non-volatile memory device may include a plurality of field regions in parallel, where the first and second fields are alternately arranged, the first fields and the second fields are longer in a first direction than a second direction perpendicular to the first direction, and the plurality of strings are between the first fields and the second fields. The bridge regions may be aligned either horizontally or diagonally. The bit line contact may extend to at least one of the two adjacent sub regions. Each of the bridge regions may be convexly curved toward at least one of the two adjacent first fields and two sub regions. The active region in each of the bridge regions may be convexly curved toward at least one of the two adjacent first fields and two sub regions. Every two strings in the active region may be connected via one of the bridge regions.

According to example embodiments, there is provided a memory card including the above non-volatile memory with shared bit lines and a controller configured to control and exchange data with the non-volatile memory. According to example embodiments there is provided an electronic system including the above non-volatile memory with shared bit lines, a processor configured to communicate with the non-volatile memory device via a bus, and an input/output device configured to communicate via the bus.

According to example embodiments, there is provided a method of fabricating a non-volatile memory device, the method including forming a plurality of field regions on a substrate in a first direction, where each of the field regions may include a single first field and a second field that is divided into two sub regions via a bridge region; growing a tunneling oxide layer on an active region defined as having a string structure by the field regions, where at least two strings are connected via one of the bridge regions; respectively forming a plurality of bit line contacts on the bridge regions; and respectively forming a plurality of shared bit lines on the field regions in the first direction.

The forming of the plurality of field regions may include depositing first, second, and third insulating layers which are different layers on the substrate, and etching the second and third insulating layers by performing a double patterning technology (DPT) process; depositing a first oxide layer over the resultant structure, and performing planarization by chemical-mechanical polishing until the second insulating layer is exposed; forming photo mask patterns on the first oxide layer, forming a trench by etching the resultant structure by using the second insulating layer and the photo mask patterns, and removing the photo mask patterns so as to obtain the bridge regions under the first oxide layer where the photo mask patterns have been removed; and obtaining the field regions in the first direction by depositing a second oxide layer over the resultant structure and performing planarization by chemical-mechanical polishing until the second insulating layer is exposed. During the growing of the tunneling oxide layer, the first and second insulating layers are removed using the second oxide layer as a mask so as to expose the active region on the resultant structure, and growing the tunneling oxide layer on the active region.

Before the forming of the plurality of bit line contacts, the method may further include forming a plurality of word lines in a second direction perpendicular to the first direction, across the upper parts of the active region and the field regions, wherein the photo mask patterns are arranged in the second direction, either in a straight line or a zigzag fashion. Each of the bit line contacts extend to at least one of two adjacent sub regions. The active region in each of the bridge regions may be convexly curved toward at least one of two adjacent first fields and two sub regions. The shared bit line may be fabricated by performing a Cu damascene process.

BRIEF DESCRIPTION OF THE DRAWINGS

Example embodiments will be more clearly understood from the following brief description taken in conjunction with the accompanying drawings. FIGS. 1-9 represent non-limiting, example embodiments as described herein.

FIG. 1 is a block diagram of a non-volatile memory according to example embodiments;

FIG. 2 is a layout diagram of part of a memory cell array of a non-volatile memory according to example embodiments;

FIG. 8 is a block diagram schematically illustrating a memory card according to example embodiments; and FIG. 9 is a block diagram schematically illustrating a system according to example embodiments.

Figure 1:
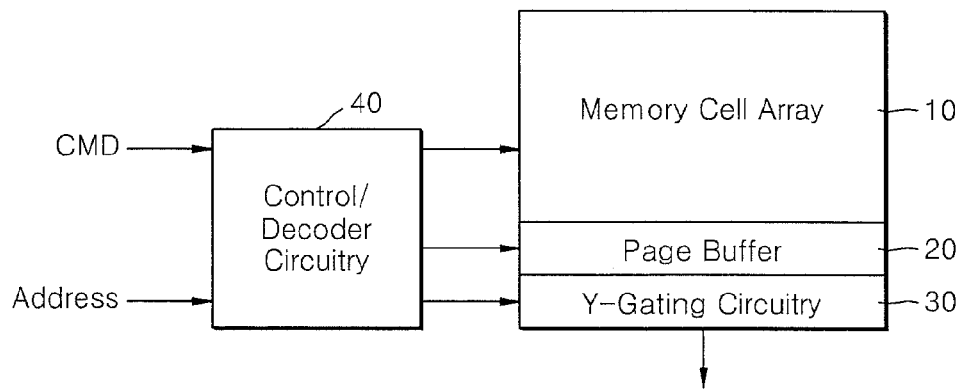

It should be noted that these Figures are intended to illustrate the general characteristics of methods, structure and/or materials utilized in certain example embodiments and to supplement the written description provided below. These drawings are not, however, to scale and may not reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a non-volatile memory according to example embodiments. Referring to FIG. 1, the non-volatile memory may include a memory cell array 10, a page buffer 20, a Y-gating circuit 30, and a control/decoder circuit 40. The memory cell array 10 may include a plurality of memory blocks and each of the memory blocks may include a plurality of non-volatile memory cells. The non-volatile memory cells may be flash memory cells, for example, NAND and/or NOR flash memory cells. The page buffer 20 may temporarily store data to be written to or to be read from the memory cell array 10. The Y-gating circuit 30 may transmit data stored in the page buffer 20. The control/decoder circuit 40 may receive a command CMD and an Address from the outside, apply a control signal for writing data to or reading data from the memory cell array 10, and decode the address. The control/decoder circuit 40 can supply a control signal for inputting data to or outputting data from the page buffer 20, and provide address information to the Y-gating circuit 30.

Figure 2:
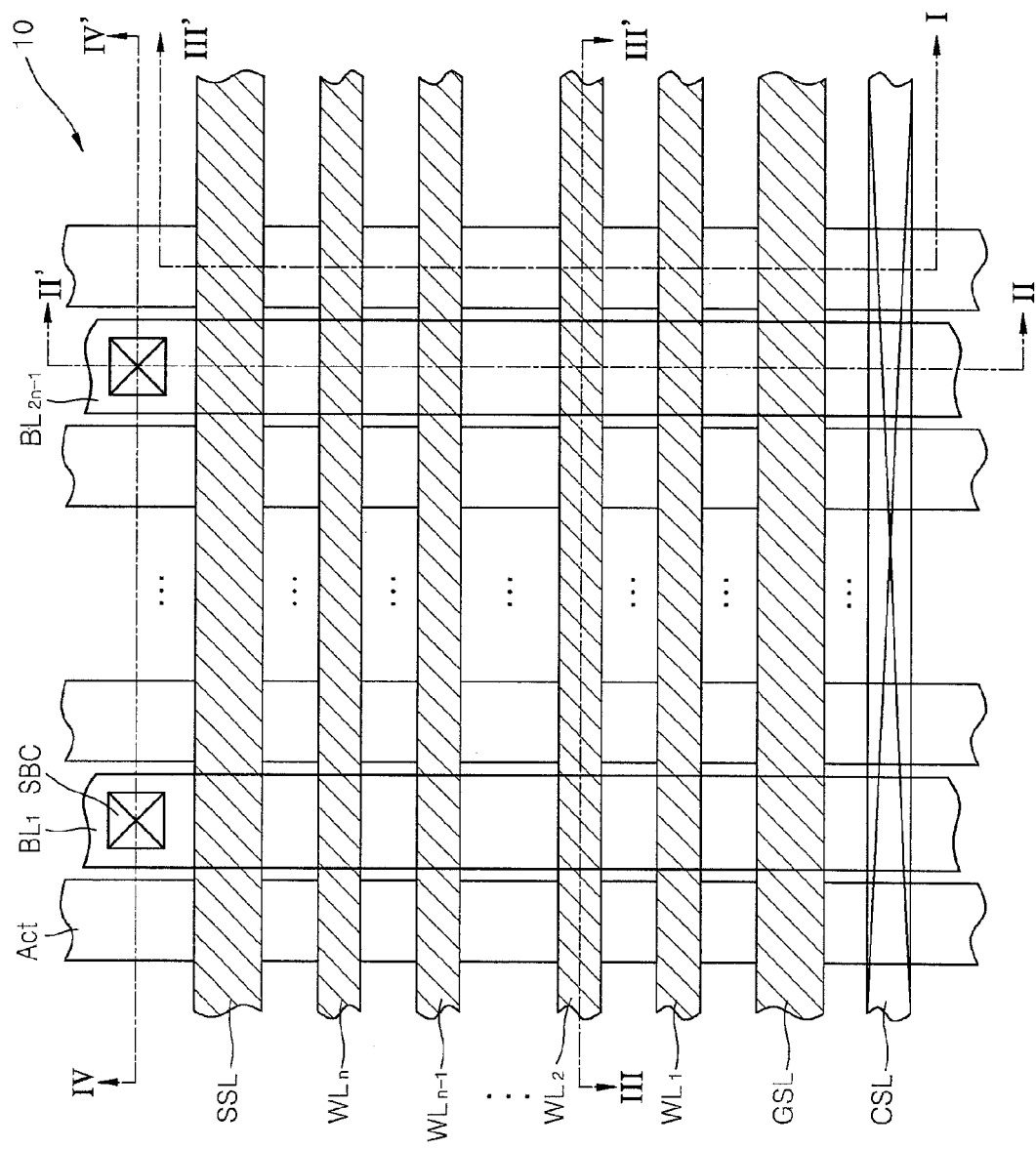
Figure 3A:
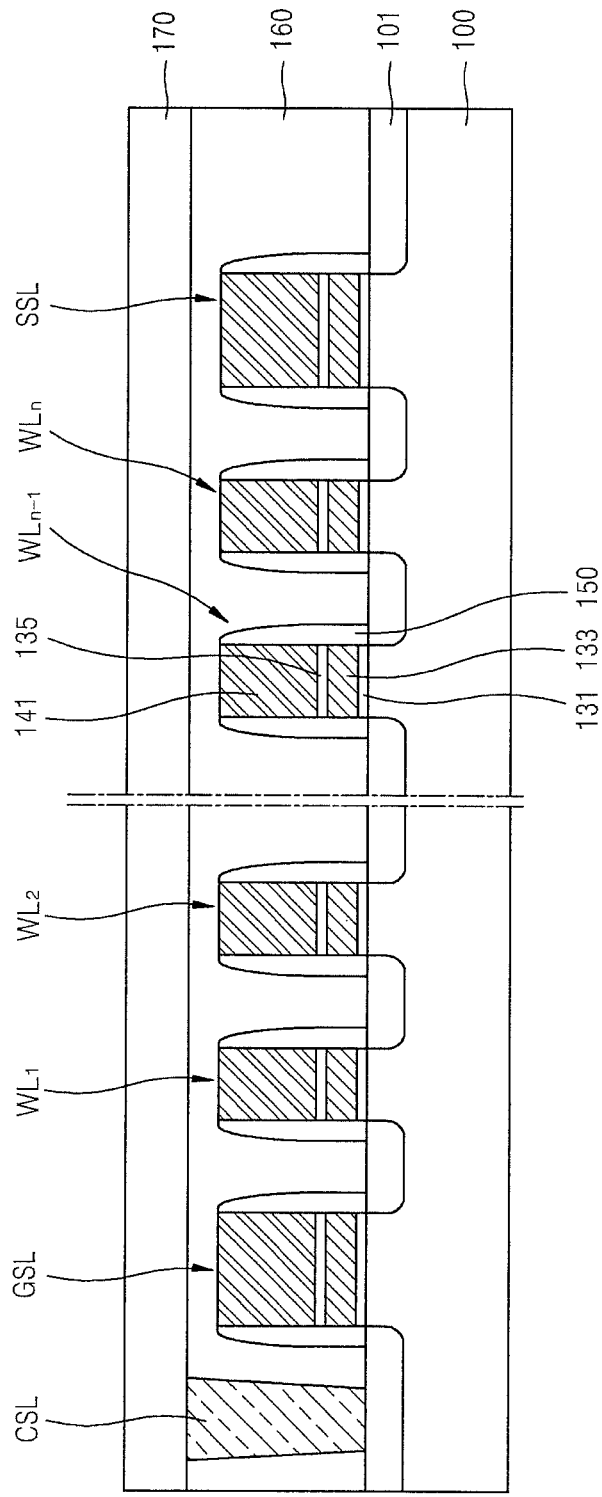
FIGS. 3A-3D are cross-sectional views taken along the lines I-I', II-II', III-III' and IV-IV' of FIG. 2.
Figure 3B:
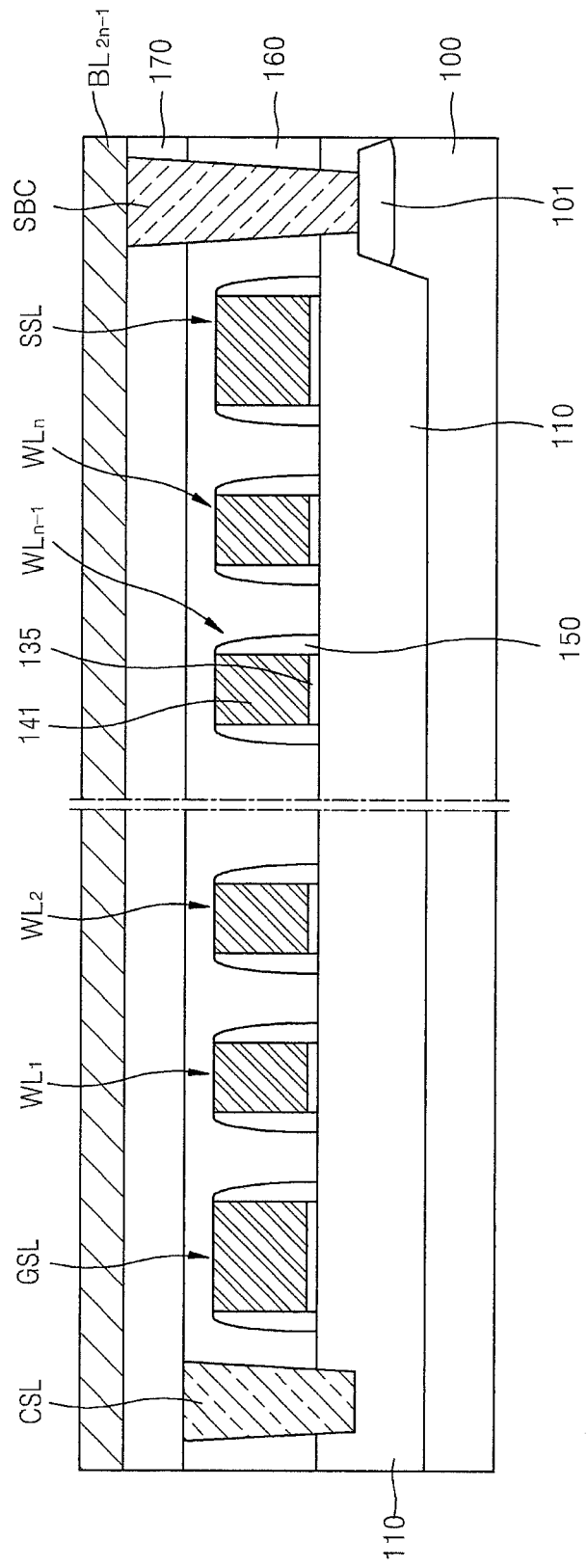
Figure 3C:
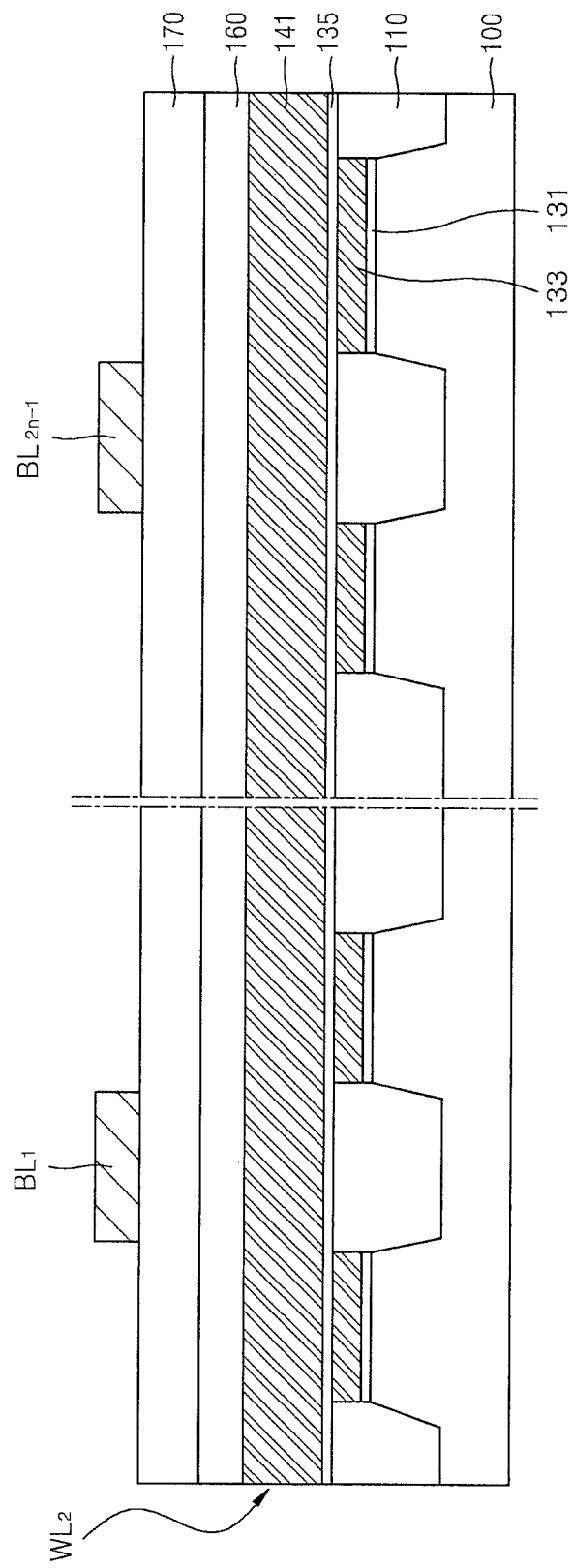
Figure 3D:
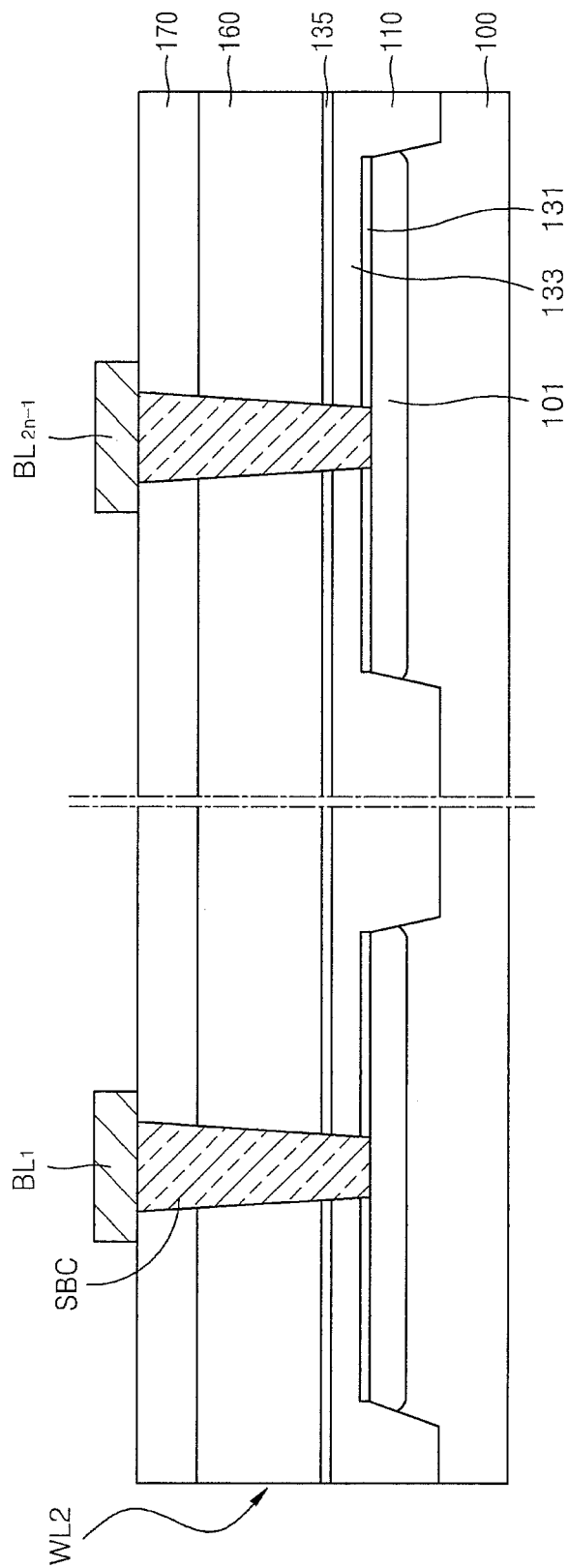

FIG. 2 is a layout diagram of part of a memory cell array 10, for example the memory cell array 10 of FIG. 1, of a non-volatile memory according to example embodiments. FIGS. 3A-3D are cross-sectional views taken along the lines I-I', II-II', III-III' and IV-IV' of FIG. 2. Referring to FIGS. 2 and 3A-3D, the memory cell array 10 may include a plurality of active regions Act defined by field regions 110 in a semiconductor layer 100. The semiconductor layer 100 may include at least one of a substrate, an epitaxial layer and a silicon-on-insulator (SOI) layer. The active regions Act may be arranged linearly, in parallel, and are generally referred to as 'active strings' or 'strings'.

A string selection line SSL and a ground selection line GSL may cross over the active regions Act. A plurality of word lines $WL_1$-$WL_n$ (where n may be any positive integer), partially shown as $WL_1$, $WL_2$, $WL_{n-1}$ and $WL_n$, may cross over the active regions Act and be arranged between the string selection line SSL and the ground selection line GSL. The string selection line SSL, the ground selection line GSL, and the word lines $WL_1$-$WL_n$ may be parallel to one another. A plurality of impurity regions 101 may be respectively formed in the active regions adjacent to both ends of the word lines $WL_1$-$WL_n$, the string selection line SSL, and the ground selection line GSL.

A string selection transistor SST, a plurality of cell transistors $CT_1$-$CT_n$, and a ground selection transistor GST may be connected in series. The string selection transistor SST, the ground selection transistor GST, and the cell transistors $CT_1$-$CT_n$ may together form a one unit memory block. The impurity region 101 adjacent to the string selection transistor SST and opposite to the ground selection line GSL may be defined as a drain region of the string selection transistors. The impurity region 101 adjacent to the ground selection transistor GST and opposite to the string selection line SSL may be defined as a source region of the ground selection transistor.

Each of the cell transistors $CT_1$-$CT_n$ may include a tunneling insulating layer 131, a charge storage layer 133, a blocking insulating layer 135, and a cell gate conductive layer 141 on the semiconductor layer 100. Each of the cell transistors $CT_1$-$CT_n$ may include a cell barrier conductive layer (not shown) and/or a word line conductive layer (not shown) on the cell gate conductive layer 141. The tunneling insulating layer 131 and the charge storage layer 133 may be separated for each of cell transistors $CT_1$-$CT_n$ in the direction of the word lines $WL_1$-$WL_n$. The top surface of the field 110 may be substantially at the same level as that of the charge storage layer 133. The tunneling insulating layer 131 may be a silicon oxide layer. The charge storage layer 133 may be a charge trapping layer and/or a floating gate conductive layer. The blocking insulating layer 135 and the cell gate conductive layer 141 may be shared by adjacent cell transistors as the word lines $WL_1$-$WL_n$. Spacers 150 may be on the side walls of the tunneling insulating layer 131, the charge storage layer 133, the blocking insulating layer 135, and the cell gate conductive layer 141. The spacers 150 may be multiple layers.

The string selection transistor SST and the ground selection transistor GST may have the same stacked structure as the cell transistors $CT_1$-$CT_n$. The widths of the string selection line SSL and the ground selection line GSL may be greater than those of the word lines $WL_1$-$WL_n$. Similarly, the widths of the string selection transistor SST and the ground selection transistor GST may be greater than those of the cell transistors $CT_1$-$CT_n$. However, example embodiments are not limited thereto.

A first interlevel insulating layer 160 may cover the word lines $WL_1$-$WL_n$, the string selection line SSL and the ground selection line GSL. A common source line CSL may be connected to the source region of the ground selection line GSL and may pass through the first interlevel insulating layer 160. The common source line CSL may be parallel with the ground selection line GSL. A second interlevel insulating layer 170 may be on the first interlevel insulating layer 160.

A shared bit-line contact SBC may pass through the first and second interlevel insulating layers 160 and 170, and be connected to the drain region of the string selection line SSL. A plurality of shared bit lines $BL_1$-$BL_m$ (where m may be any positive integer) may be located on the second interlevel insulating layer 170 above and crossing the word lines $WL_1$-$WL_n$ and being connected to shared bit line contacts SBC. The shared bit lines $BL_1$-$BL_m$ may be arranged parallel to one another on the field regions 110 and the total number of the shared bit lines $BL_1$-$BL_m$ may be half that of the word lines $WL_1$-$WL_n$ (e.g., m may equal n/2).

Figure 4A:
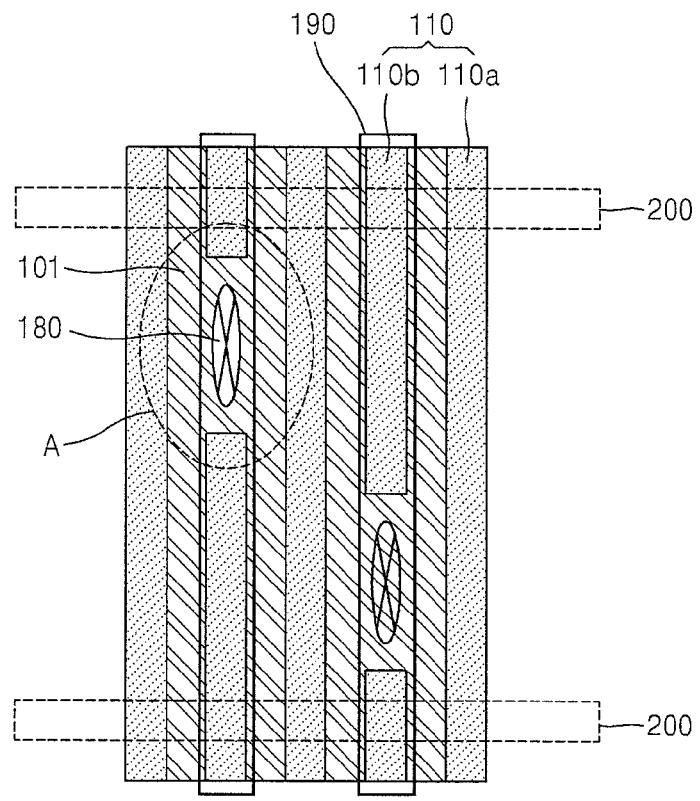
FIGS. 4A-4H are layout diagrams of bridge regions and a shared bit line contact (SBC) according to example embodiments.

The shared bit lines $BL_1$-$BL_m$ and the shared bit line contact SBC will now be described in greater detail with reference to FIGS. 4A-4H, which are layout diagrams of bridge regions and shared bit-line contacts SBC according to example embodiments. Only part of a cell region in which shared bit lines and shared bit line contacts are disposed is schematically illustrated. FIG. 4A illustrates active regions 101 and field regions 110 on a substrate (not shown) in columnar form. Each of the field regions 110 is shown subdivided into two columnar fields, first field 110a and second field 110b, separated by an active region 101. The second fields 110b are also shown vertically subdivided into upper and lower sub regions by a bridge region A.

A shared bit line 190 may be on second field 110b but not on first field 110a of each of the field regions 110. Thus, the total number of bit lines may be half that of conventional bit lines where one bit line is connected to each string of an active region. The pitch between the second fields 110b which may include the shared bit lines 190 may be greater than in the case of the conventional art (e.g., three times greater). Accordingly, even if the widths of the shared bit lines 190 are increased, interference may not occur between the shared bit lines 190.

The bridge region A may be located within each of the second fields 110b and a shared bit line contact 180 may be in the bridge region A. The shared bit line contact 180 may be easy to form since the second field 110b including the bridge region A may be wide. The shared bit line contact 180 may have various shapes. The shared bit line contacts 180 may be at different locations relative to each other. For example, the bit line contacts 180 may be vertically aligned to each other or may be vertically staggered in a zigzag fashion, as illustrated in FIGS. 4A-4D. Bit line contacts 180 may have a greater margin when staggered in a zigzag fashion. The location of the shared bit line contact 180 may depend on the location of the bridge region A, which will be described below with reference to FIGS. 5A-5N.

Methods of fabricating the bridge region A that divides the second field 110b into sub regions will now be described. According to example embodiments, an oxide layer that is the same as an oxide layer of field regions may be thinly formed on active regions in the bridge region A without exposing the active regions. Alternatively, active regions in the bridge region A may be exposed and a tunneling oxide layer may be grown on the active regions. The former case may be preferable since an additional patterning process may be required in order to expose active regions in the bridge regions.

According to example embodiments, dotted boxes 200 in FIGS. 4A-4H denote upper and lower string selection lines spaced vertically apart. In a non-volatile memory device according to example embodiments, memory cells in cell regions having a symmetric structure with respect to the shared bit line contacts 180 may be below the lower string selection line and above the upper string selection line. The area in which the bit line contacts 180 are shown may not include memory cells and therefore may not include word lines.

Figure 4B:
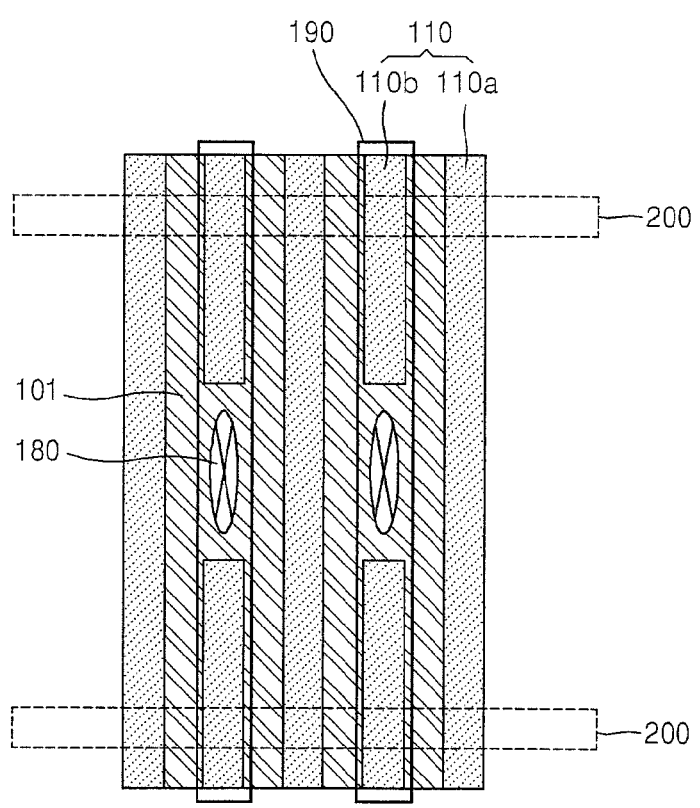
Figure 4C:
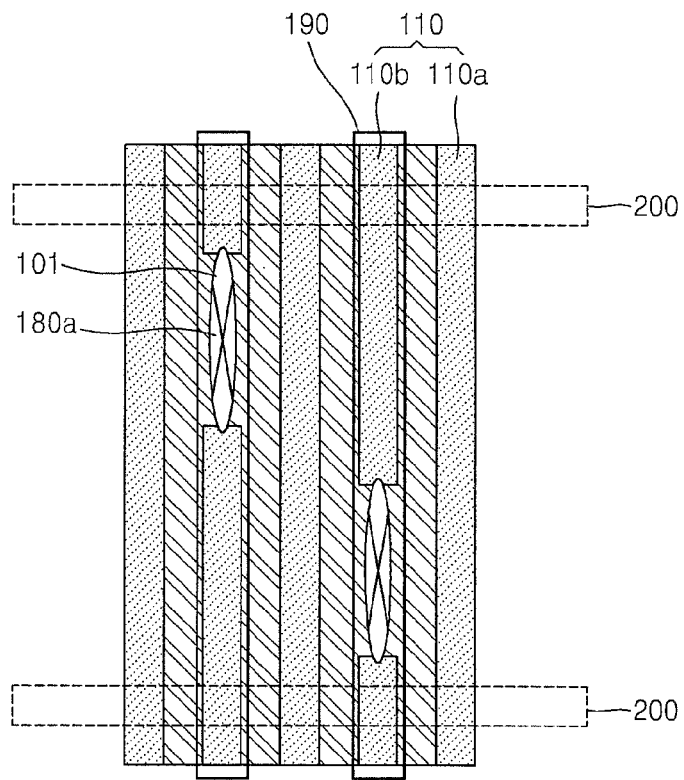
Figure 4D:
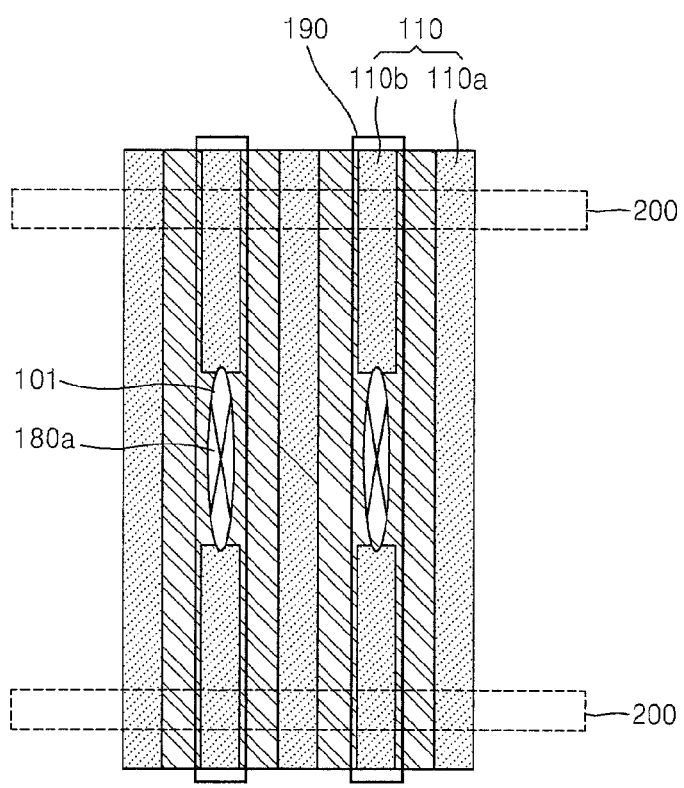

FIG. 4B is similar to FIG. 4A except that bridge regions A and shared bit line contacts 180 are horizontally aligned and form a straight line parallel to string selection lines SSLs 200. Referring to FIG. 4C, each of shared bit line contacts 180a may be in a bridge region and extend into neighboring sub regions of a second field 110b. According to example embodiments, the bit line contact 180a may extend into only one of the sub regions. FIG. 4D is similar to FIG. 4C except that bridge regions and shared bit line contacts 180a are vertically aligned and form a straight horizontal line parallel to string selection lines SSLs 200.

Figure 4E:
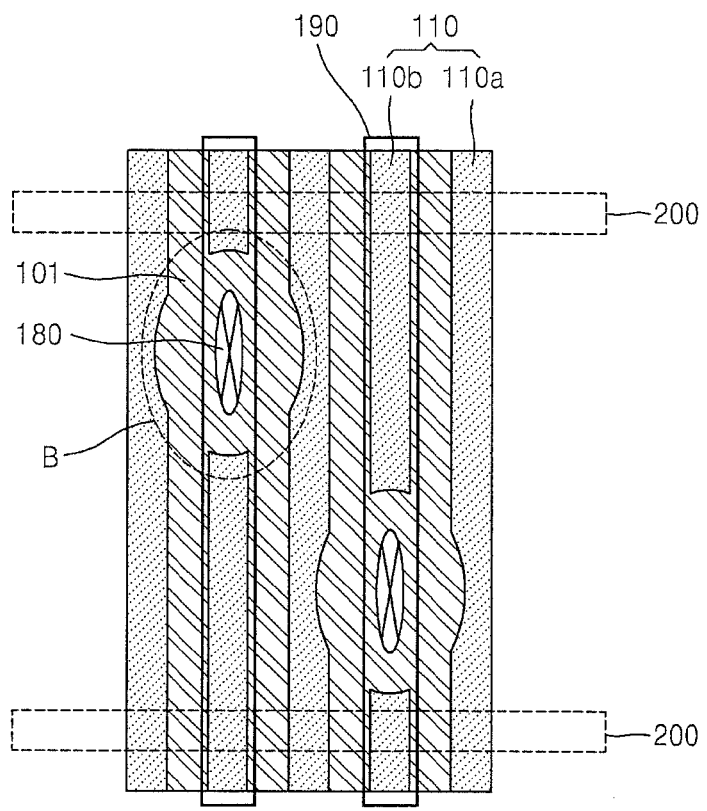
Figure 4F:
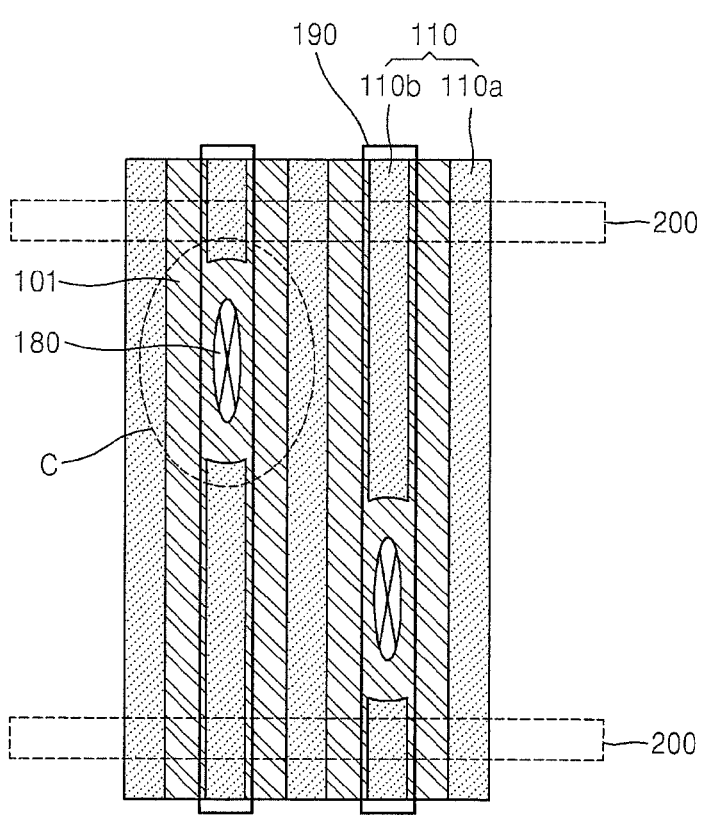
Figure 4G:
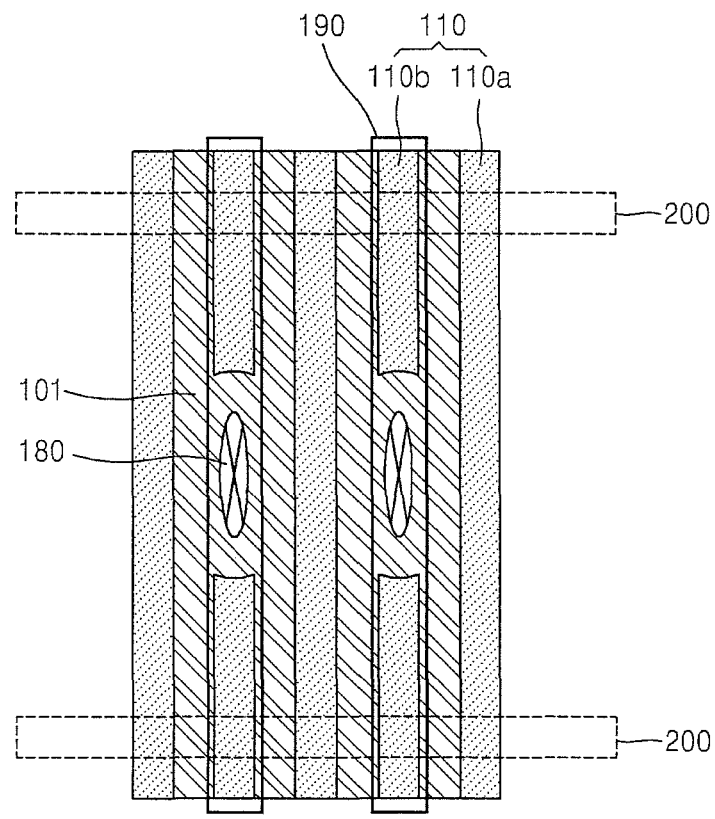
Figure 4H:
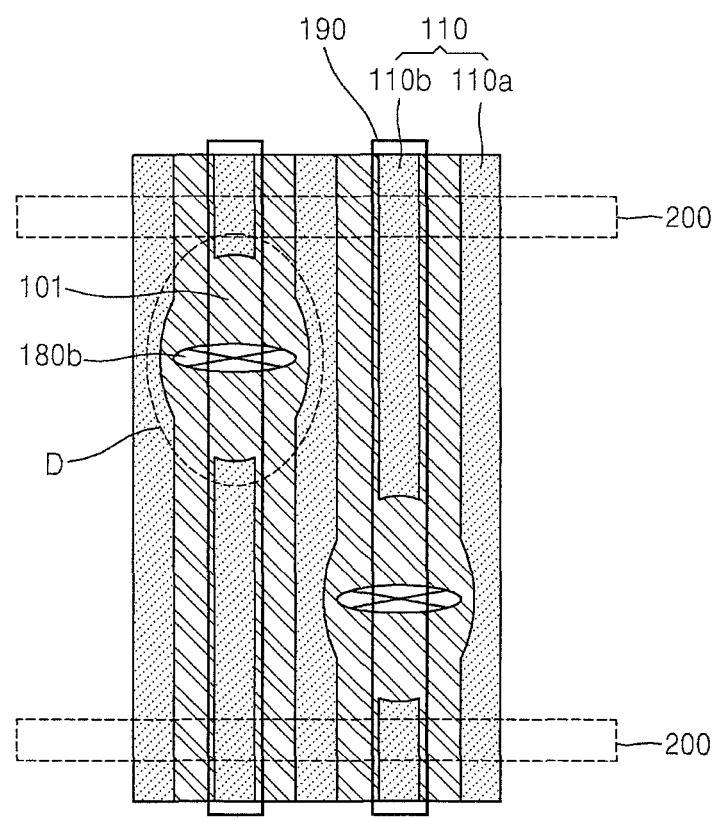

Referring to FIG. 4E, an active region in each of bridge regions B may extend into two adjacent fields and two adjacent sub regions. For example, upper and lower sub regions of a second field 110b and right and left first fields 110a. Therefore, the active region may be convexly curved into these fields and sub regions. This shape of the active region in the bridge region B may be obtained, for example, by intentionally patterning during the formation of the bridge region B or by controlling the degree of etching during an etching process. Since the bridge region B is large, it is possible to secure a large space for the shared bit line contact 180, thereby simplifying a contact process. Referring to FIG. 4F, an active region in each of bridge regions C may be convexly curved only towards upper and lower sub regions of a second field 110b. FIG. 4G is similar to FIG. 4F except that bridge regions C and shared bit line contacts 180 are vertically aligned and form a straight horizontal line parallel to string selection lines SSLs 200. Referring to FIG. 4H, bridge regions D may be similar to the bridge regions B illustrated in FIG. 4E but each shared bit line contact 180b is oriented such that it is wider horizontally than vertically in a second field 110b.

The shape and positioning of shared bit line contacts in bridge regions has been particularly described but example embodiments are not limited thereto. For example, an active region in a bridge region may be convexly curved toward at least one of two adjacent fields and/or two adjacent sub regions. Also, each shared bit line contact may extend to the sub regions of a field in a convexly curved bridge region as illustrated in FIG. 4C or 4D. If active regions in bridge regions are convexly curved toward right and left fields, the bridge regions may be in a zigzag fashion rather than in a straight line. The benefits of increasing the size of an active region by using a wider bridge region may include: (1) easier formation of a shared bit line contact because the shared bit line contact may be larger; and (2) reduced resistance of the shared bit line contact due to the increased contact area to an active region (at the bottom of the bridge region) or to a bit line (at the top of the bridge region). Shared bit lines and shared bit line contacts according to example embodiments can be applied to various types of non-volatile memory device (e.g., NAND flash memory devices and/or NOR flash memory devices).

Figure 5A:
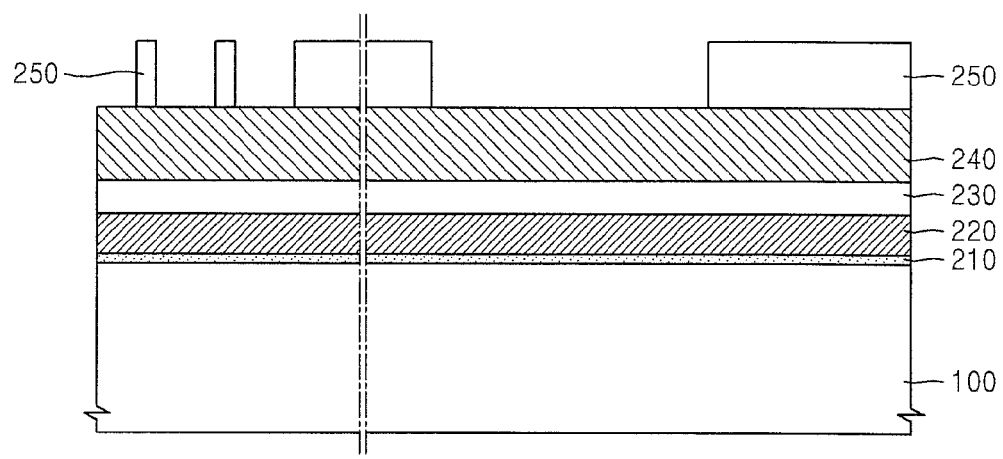
FIGS. 5A-5N are cross-sectional views illustrating a method of fabricating a non-volatile memory including shared bit lines according to example embodiments.
Figure 5B:
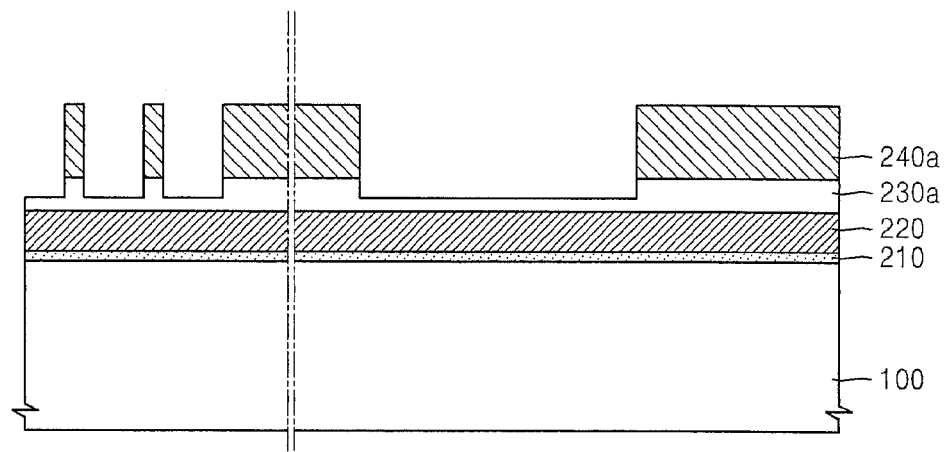
Figure 5C:
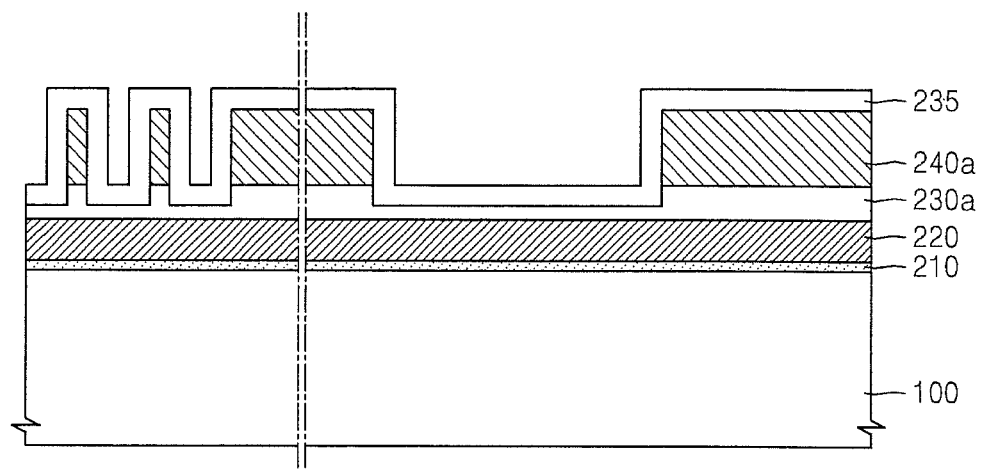
Figure 5D:
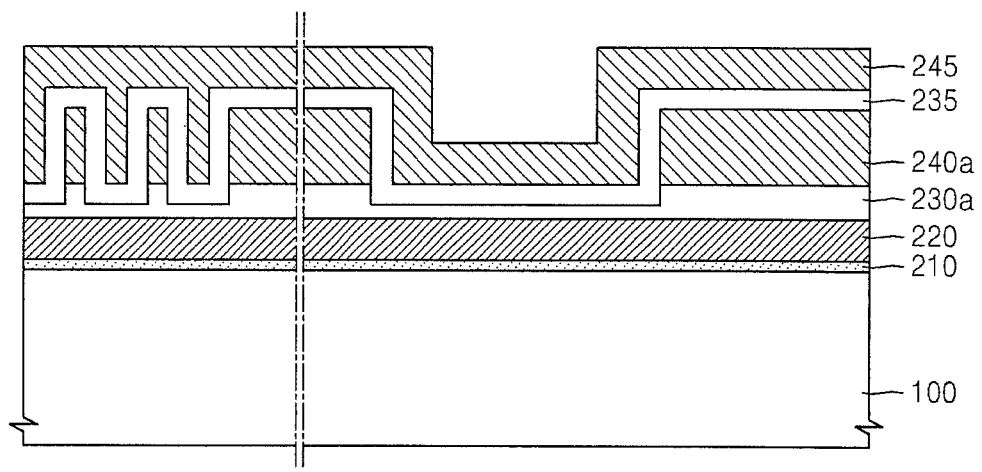
Figure 5E:
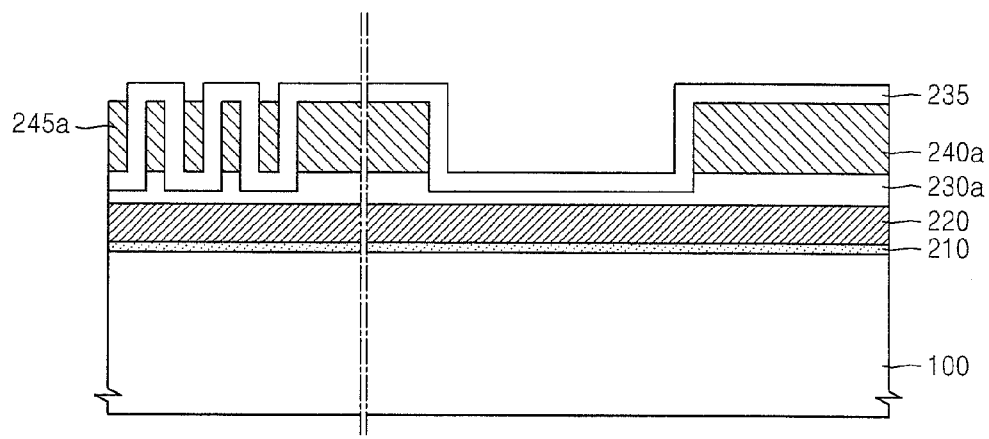
Figure 5F:
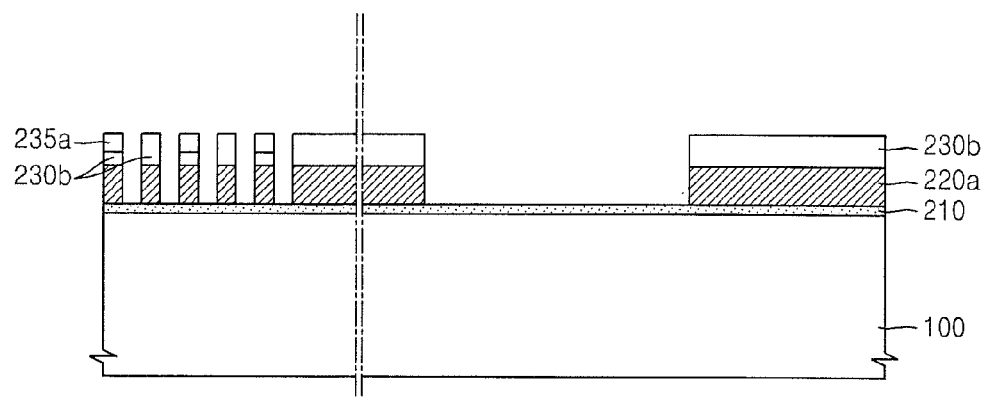
Figure 5G:
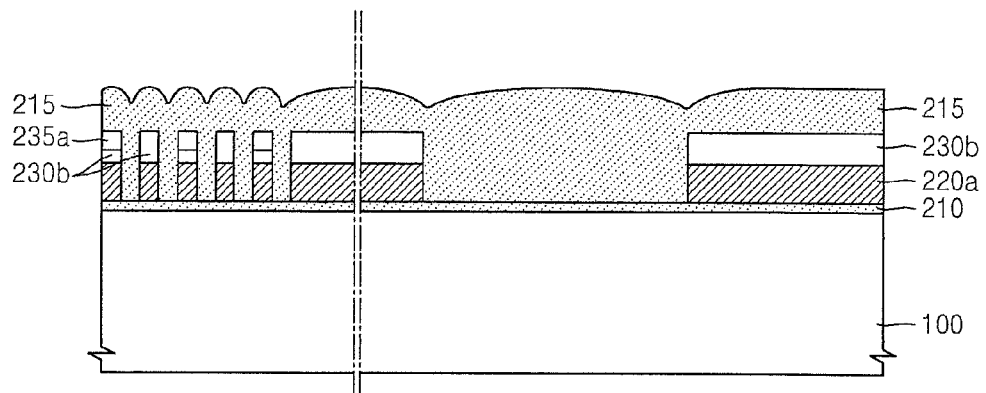
Figure 5H:
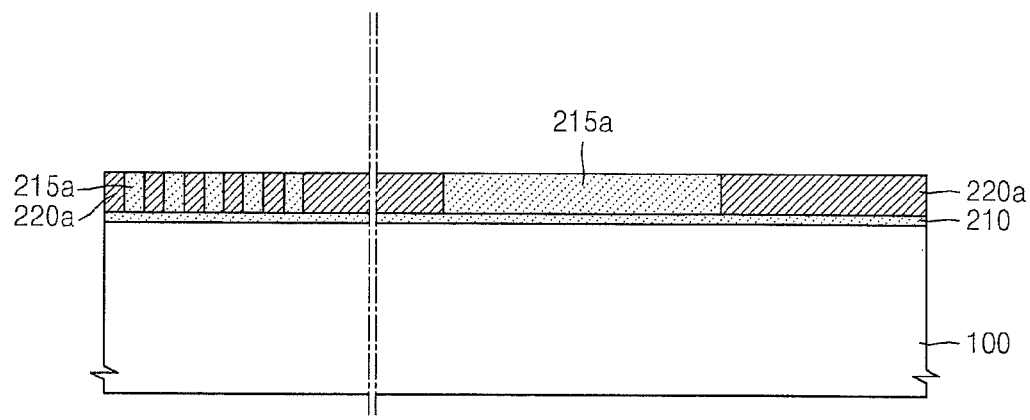
Figure 5I:
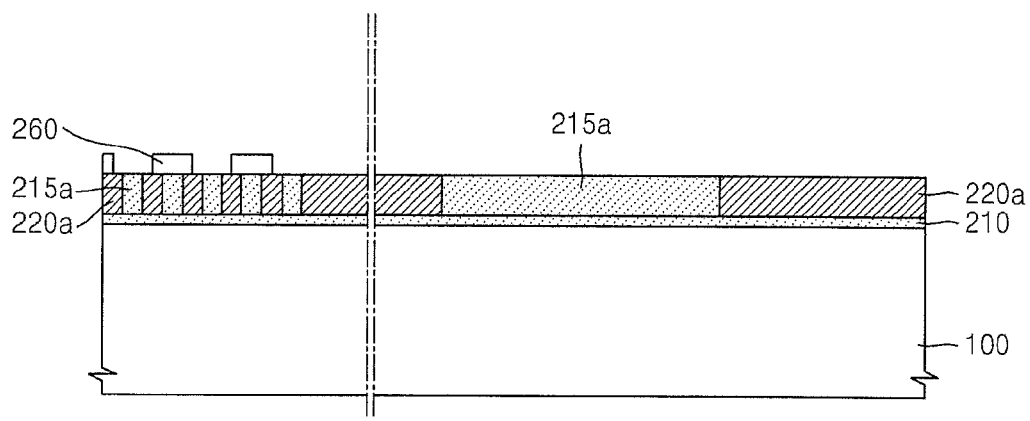
Figure 5J:
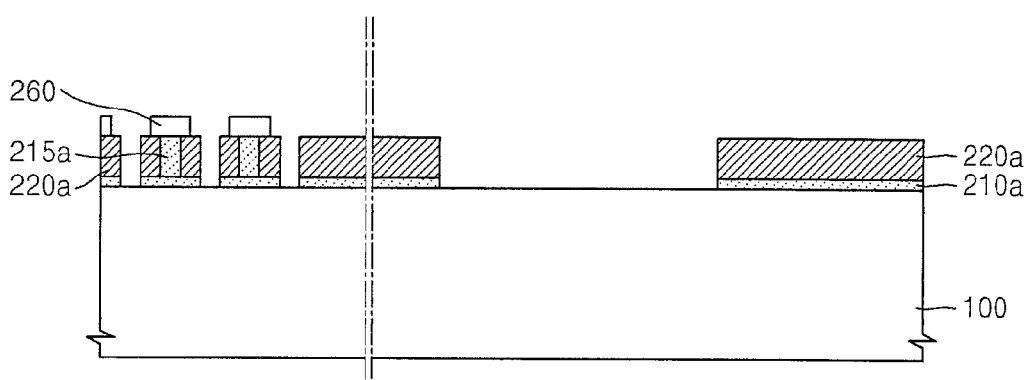
Figure 5K:
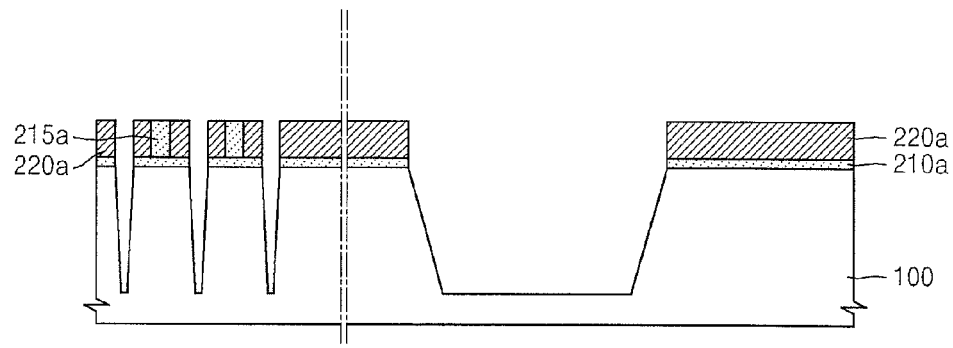
Figure 5L:
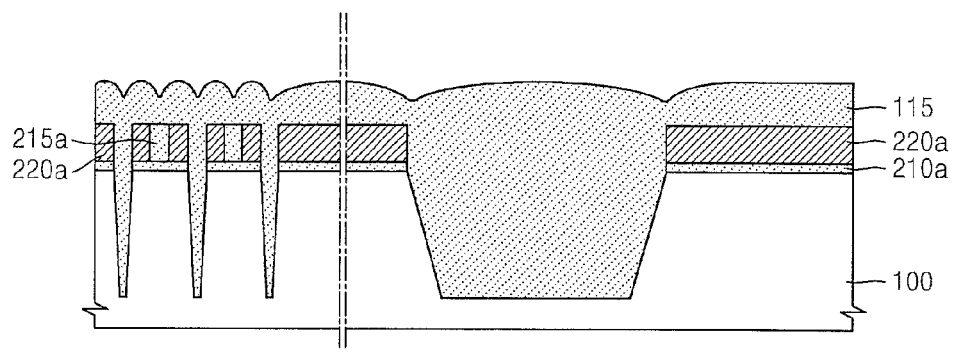
Figure 5M:
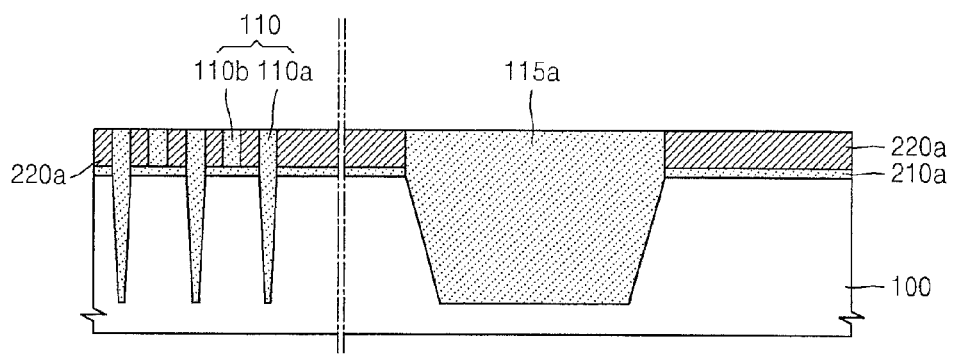
Figure 5N:
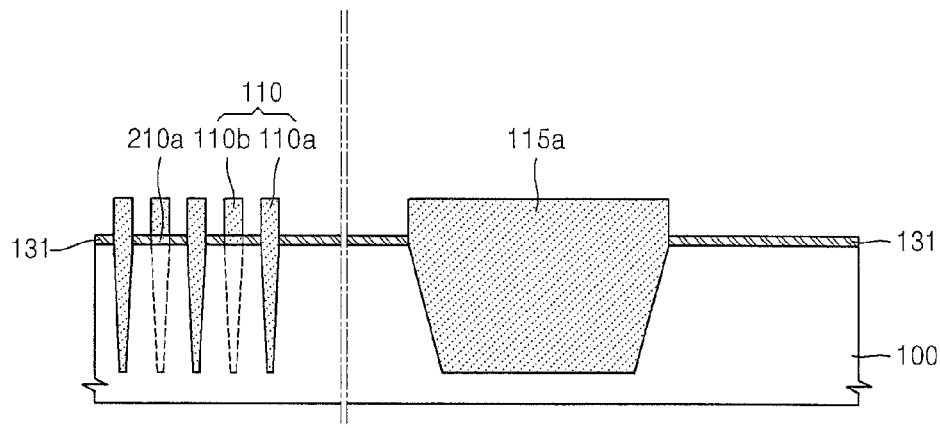

FIGS. 5A-5N are cross-sectional views illustrating methods of fabricating a non-volatile memory device with shared bit lines according to example embodiments. FIGS. 6A-6E are plan views respectively corresponding to FIGS. 5I, 5J, 5K, 5M and 5N. Referring to FIG. 5A, a first insulating layer 210, a second insulating layer 220, a third insulating layer 230 and a poly silicon layer 240 may be sequentially formed on a substrate 100. Photo mask patterns 250 may be formed on the poly silicon layer 240 by performing a photolithographic process. The first insulating layer 210 may be a pad oxide layer, the second insulating layer 220 may be a silicon nitride (SiN) layer, and the third insulating layer 230 may be a medium temperature deposition of oxide (MTO) layer. However, example embodiments are not limited thereto. The resultant structure shown in FIG. 5A may be divided into two parts with respect to dotted lines: a left pattern that may become a cell region and a right pattern for forming an isolation layer in order to separate the cell region from other peripheral circuit regions. The right pattern may be larger than the left pattern.

Referring to FIG. 5A, the third insulating layer 230, (e.g., a MTO layer), may be etched by performing an etching process using the photo mask patterns 250 as a mask. The photo mask patterns 250 may be removed (e.g., by performing an ashing/strip process). Referring to FIG. 5B, the etch process may result in a poly silicon layer 240a and third insulating layer 230a. Referring to FIG. 5C, a fourth insulating layer 235 may be thinly formed over the poly silicon layer 240a and the third insulating layer 230a by performing, for example, atomic layer deposition (ALD). The fourth insulating layer 235 may be formed of the same material as the third insulating layer 230a (e.g., a MTO layer). The fourth insulating layer 235 may be formed such that the thickness of the fourth insulating layer 235 is equal to the distance of recessed portions thereof in the cell region. The thickness of the fourth insulating layer 235 may be equal to the intervals between active strings or fields in the finally obtained memory device.

Referring to FIG. 5D, a poly silicon layer 245 may be formed on the fourth insulating layer 235. A portion of the polysilicon layer 245 on the fourth insulating layer 235 may be removed (e.g., by performing an etch-back process) to form polysilicon layer 245a in FIG. 5E. The poly silicon layer 245 in the right (e.g., larger) pattern may be completely removed by performing, for example, an etch-back process. The polysilicon layer 245 in the left (e.g., smaller) pattern between the recessed portions of the fourth insulating layer 235 may be partially removed. Referring to FIG. 5E, the remains of poly silicon layer 245 are shown as polysilicon layer 245a. Poly silicon layers 240a and 245a may be used as masks in order to perform patterning on the second insulating layer 220 (e.g., performing an etch process), thereby removing the poly silicon layers 240a and 245a, resulting in the structure of FIG. 5F. Referring to FIG. 5F, although the fourth insulating layer 235 has been removed from the right pattern it may partially remain in the left pattern as fourth insulating layer 235a. The third insulating layer 230a may remain in the right and left pattern as third insulating layer 230b. The process described above with respect to FIGS. 5A-5F may be referred to as a double patterning technology (DPT) process.

Referring to FIG. 5G, a gap-fill process may be performed on the structure shown in FIG. 5F using an oxide layer 215. The oxide layer 215 may be deposited to fill gaps between the patterns of the third and fourth insulating layers 230b and 235a (e.g., the MTO layers) and the second insulating layer 220a on the substrate 100. Planarization may be performed on the structure shown in FIG. 5G (e.g., chemical-mechanical polishing (CMP)) so that the second insulating layer 220a may be exposed, as shown in FIG. 5H. After planarization, a process of forming a bridge region according to example embodiments follows, which will now be described also with reference to FIGS. 6A-6E.

Figure 6A:
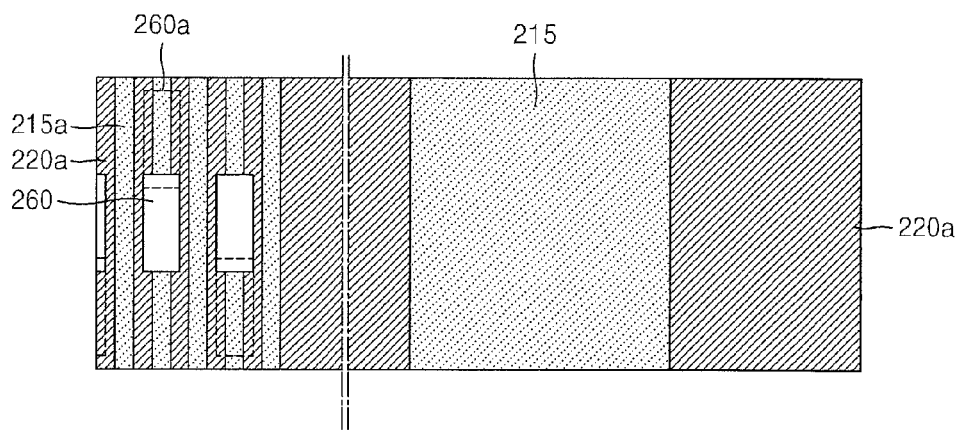
FIGS. 6A-6E are plan views respectively corresponding to FIGS. 5I, 5J, 5K, 5M and 5N.
Figure 6B:
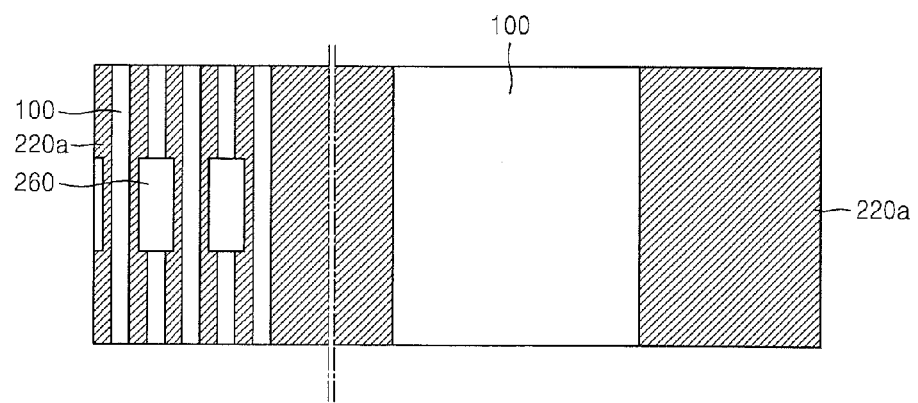
Figure 6C:
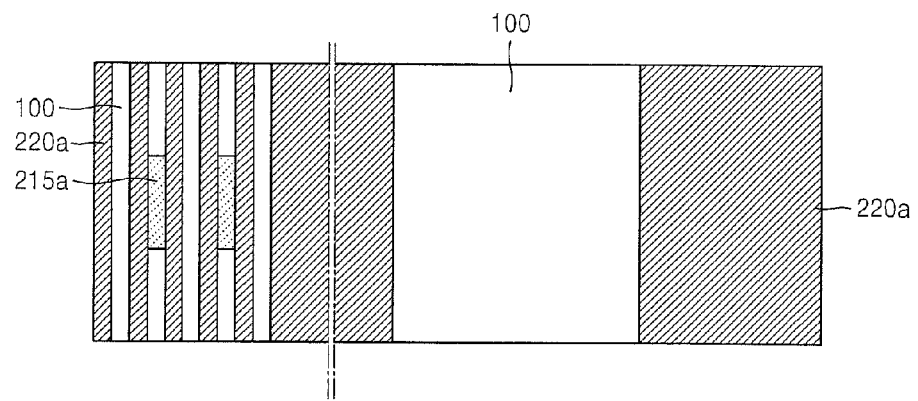

Referring to FIGS. 5I and 6A, photo mask patterns 260 may be formed on the second insulating layer 220a and the oxide layer 215a. The photo mask patterns 260 are formed only in the cell region, in which shared bit line contacts are to be formed outside a string selection line SSL. Referring to FIG. 6A, as described above, the photo mask patterns 260 may be formed in a straight line parallel to a plurality of word lines but may also be formed in a zigzag fashion along word lines as indicated with dotted boxes 260a. Referring to FIGS. 5J and 6B, the oxide layer 215a and the first insulating layer 210 shown in FIG. 5I may be partially removed (e.g., by etching) using the photo mask pattern 260 and the second insulating layer 220a as masks. Referring to FIGS. 5K and 6C, in order to form field regions and an isolation layer, trenches may be formed in the substrate 100 by using the pattern shown in FIG. 5J as a mask. The photo mask pattern 260 shown in FIG. 5J may be removed (e.g., by performing an ashing/strip process). Referring to FIG. 5L, a gap-fill process may be performed over the structure shown in FIG. 5K to form an oxide layer 115.

Figure 6D:
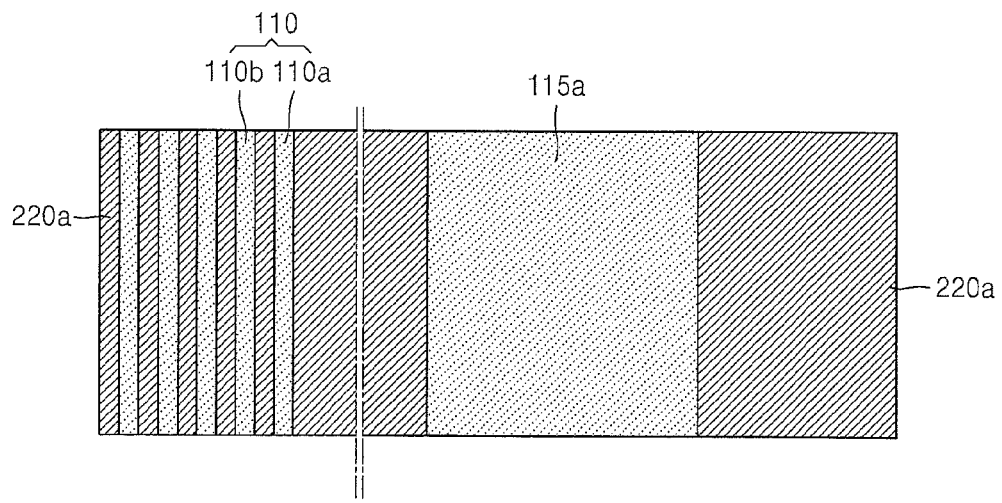

Referring to FIGS. 5M and 6D, planarization (e.g., CMP) may be performed on the structure shown in FIG. 5L until the second insulating layer 220a is exposed, thereby obtaining field regions 110 and isolation layer 115a. Although not specifically illustrated in FIG. 6D, each of the field regions 110 may have a second field 110b divided into two sub regions via a bridge region, and a single first field 110a. The second field 110b may have a thinly formed oxide layer on the bridge region and the bottom thereof may contact an upper part of the substrate 100. Hereinafter, the upper part of the substrate 100 will be referred to as an active region consistent with FIGS. 1-4H. Although an active region is substantially obtained after performing ion implantation on the upper part of the substrate 100, the upper part of the substrate 100 will now be referred to as the active region for convenience of explanation.

Figure 6E:
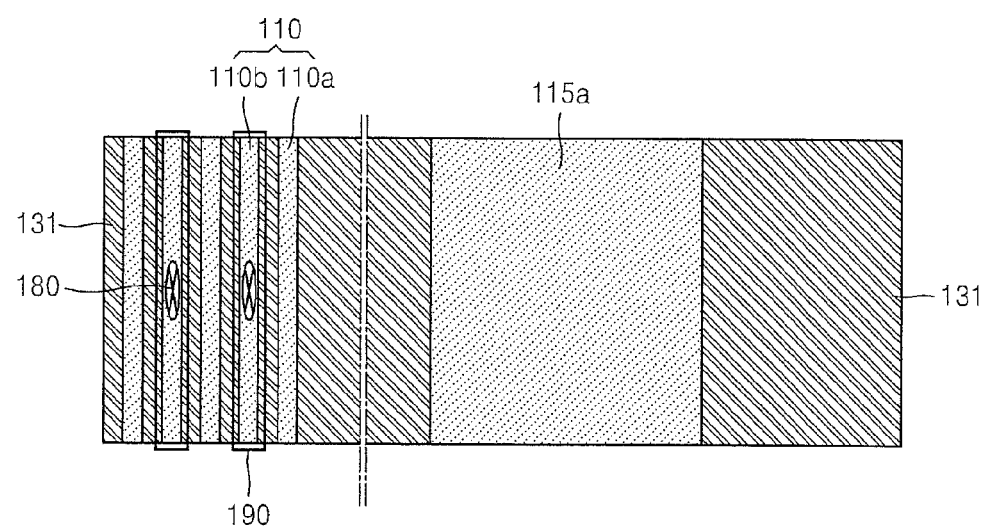

Referring to FIGS. 5N and 6E, the active regions may be exposed by removing the second insulating layer 220a and the first insulating layer 210a under the second insulating layer 220a of FIG. 5M, by using field regions 110 and isolation layer 115a as masks. Tunneling oxide layer 131 may be grown on the exposed active regions. For a better understanding of example embodiments, FIG. 6E illustrates shared bit lines 190 and shared bit line contacts 180 which will later be formed. Each of the shared bit lines 190 may be placed on second field 110b of field regions 110, in which a bridge region exists. Shared bit line contact 180 may be formed in the bridge region of second field 110b. In FIG. 5N, lower parts of the second fields 110b are indicated with a dotted line in the substrate 100, which may mean that except for the bridge regions, second fields 110b may be formed similar to first fields 110a in the direction of bit lines. According to example embodiment shared bit line contacts 180 may be arranged in a straight line. However, as described above, the arrangement of the bridge regions may be controlled by changing the array of the photo mask patterns 260 during the formation of the photo mask patterns 260, illustrated in FIG. 6A, and the arrangement of the shared bit line contacts 180 can be adjusted accordingly. A plurality of fields adjacent to the bridge regions can also be formed in various shapes as illustrated in FIGS. 4A-4H.

A subsequent process of fabricating a non-volatile memory device may be performed in a conventional manner, and therefore, a detailed description thereof is omitted. For example, the shared bit line contacts may be formed by forming contact hole vias that expose the active regions in the bridge regions, by etching the insulating layers formed on the bridge regions, performing ion implantation in order to reduce contact resistance at the bottoms of the contact holes, depositing a barrier metal layer along inner surfaces of the contact holes, and filling the resultant contact holes with a conductive material. The barrier metal may be a SiN spacer/Ti/TiN or Ti/TiN but is not limited thereto. However, since a large space for a contact region is secured during formation of shared bit line contacts, a contact process may be improved over the conventional art. Also, since the intervals between the shared bit lines may be increased, a bit line formation process may be improved. For example, if bit lines are formed of copper (Cu) that is cheap and has high conductivity, the damascene process may be used. Conventionally, there are difficulties forming bit lines at narrow intervals by using the Cu damascene process. However, according to example embodiments, the intervals between bit lines may be three times wider than in the prior art by employing shared bit lines, and thus, a Cu damascene process may be performed.

Figure 7A:
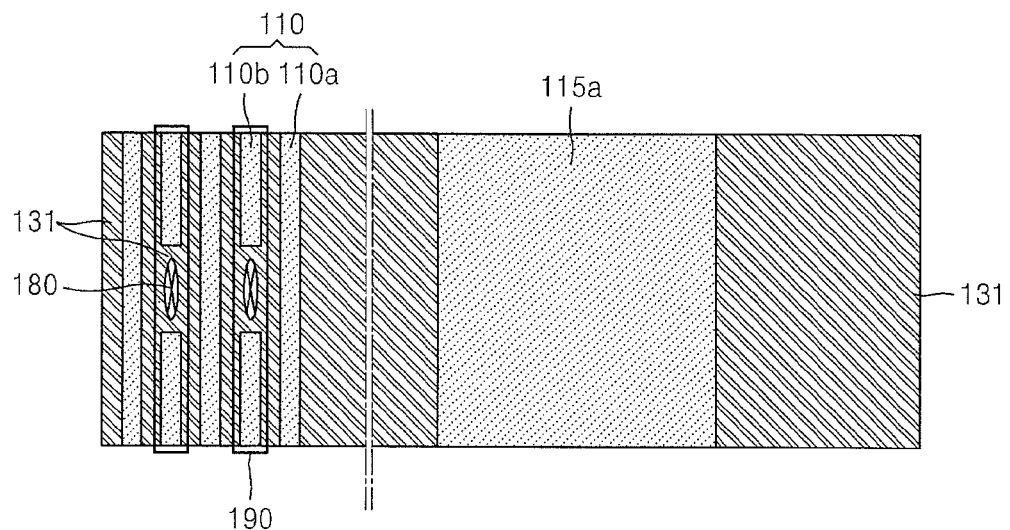
FIGS. 7A and 7B are, respectively, a plan view and a cross-sectional view of a non-volatile memory according to example embodiments.
Figure 7B:
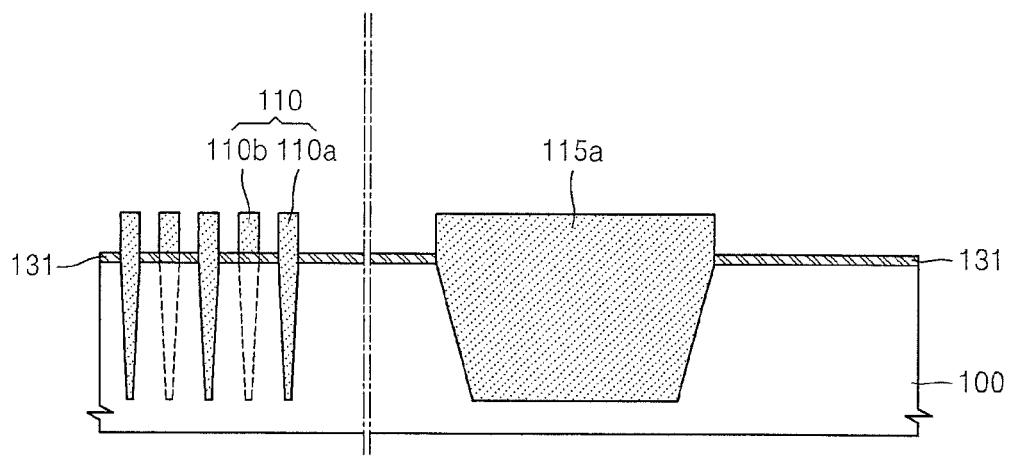

FIGS. 7A and 7B are, respectively, a plan view and a cross-sectional view of a non-volatile memory device according to example embodiments. Referring to FIGS. 7A and 7B, the structures of shared bit lines or shared bit line contacts according to example embodiments may be similar to those illustrated in FIGS. 5N and 6E except for the bridge region structures. Referring to FIGS. 5M and 6D, first insulating layer 210a and oxide layer 215a (labeled in FIG. 5L) may remain on active regions of the bridge region but according to example embodiments shown in FIGS. 7A and 7B, tunneling oxide layer 131 may be formed on active regions instead of first insulating layer 210a and oxide layer 215a. The first insulating layer 210a and the oxide layer 215a on the active region of the bridge regions may be removed to expose the active regions. The bridge regions according to example embodiments shown in FIGS. 7A and 7B may be formed by removing the first and second insulating layers 210*a* and 220*a* in FIG. 5M after performing the planarization process, removing first insulating layer 210*a* and oxide layer 215*a* in order to expose the active regions in the bridge regions, and then, growing the tunneling oxide layer 131 over the resultant structure.

As described above, in a non-volatile memory device having shared bit lines and a method of fabricating the same according to example embodiments, it is possible to minimize or reduce interference between bit lines and eliminate the use of a DPT process which is a complicated process to manufacture bit lines. Also, shared bit line contacts may be formed for the shared bit lines by using bridge regions such that a less complex bit line contact process and a Cu damascene process for manufacturing bit lines may be used, thereby reducing manufacturing costs. Also, since the intervals between bit lines and a contact area for contacts may be large, parasitic capacitance and resistance may be reduced and the performance of the device may be improved.

Figure 8:
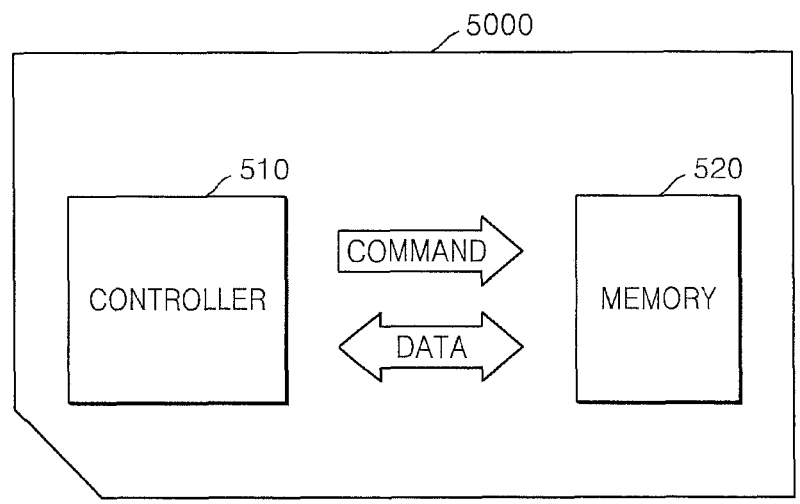

FIG. 8 is a diagram schematically illustrating a memory card 5000 according to example embodiments. Referring to FIG. 8, a controller 510 and a memory 520 may be arranged to exchange an electrical signal with each other. For example, when the controller 510 gives a command to the memory 520, the memory 520 may transmit data. The memory 520 may include a non-volatile memory device, such as the non-volatile memory device of FIGS. 1-7B, according to example embodiments. Non-volatile memory devices according to example embodiments can be disposed in NAND or NOR architecture arrays according to a desired logic gate design, wherein such NAND and NOR arrays are generally known in the conventional art. The memory arrays disposed in a plurality of rows and columns can form one or more memory array banks (not shown). Although not shown, the memory 520 may include such a memory array or such a memory array bank, all of which are known in the conventional art. The memory card 5000 can further include conventional members, such as a conventional row decoder (not shown), a column decoder (not shown), input/output (I/O) buffers (now shown), and/or a control resistor (not shown) in order to drive the memory array bank, all of which are known in the conventional art. The memory card 5000 may be used as a memory device, for example, a memory stick card, a smart media (SM) card, a secure digital (SD) card, a mini SD card, or a multimedia card (MMC).

Figure 9:
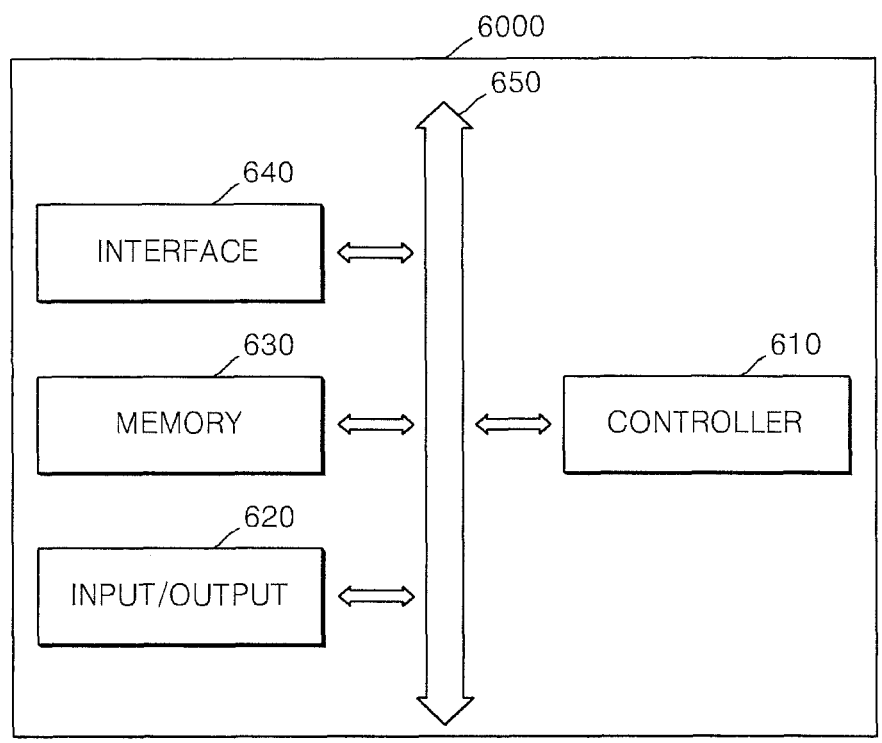

FIG. 9 is a block diagram schematically illustrating an electronic system 6000 according to example embodiments. Referring to FIG. 9, the system 6000 may include a controller 610, an input/output device 620, a memory 630, and an interface 640. The system 6000 may be a mobile system or a system that transmits or receives data. The mobile system may be, for example, a personal digital assistant (PDA), a portable computer, a web tablet, a wireless phone, a mobile phone, a digital music player, or a memory card. The controller 610 may execute a software program and control the electronic system 6000. The controller 610 may be, for example, a microprocessor, a digital signal processor, or a microcontroller. The input/output device 620 can be used to input or output data to or from the electronic system 6000. The electronic system 6000 may be connected to an external apparatus, for example, a personal computer or a network, by using the input/output device 620, in order to send data to or receive data from the external apparatus. The input/output device 620 may be, for example, a keypad, a keyboard, or a display. The memory 630 may store codes and/or data for operating the controller 610 and/or may store data processed by the controller 610. The memory 630 may include a non-volatile memory device of FIGS. 1-7B, according to example embodiments. The interface 640 may be a data transmission path between the system 6000 and an external apparatus. The controller 610, the input/output device 620, the memory 630, and the interface 640 may communicate with one another via a bus 650. For example, the system 6000 can be applied to a mobile phone, an MP3 player, a navigation system, a portable multimedia player (PMP), a solid state disk (SSD), or a household appliance.

While example embodiments have been particularly shown and described, it will be understood by one of ordinary skill in the art that variations in form and detail may be made therein without departing from the spirit and scope of the claims.

What is claimed is:

1. A method of fabricating a non-volatile memory device, the method comprising:

forming a plurality of field regions on a substrate in a first direction, where each of the field regions includes a homogeneous first field and a second field that is divided into two sub regions via a bridge region, the forming a plurality of field regions including,
depositing first, second, and third insulating layers on the substrate; and
etching the second and third insulating layers by performing a double patterning technology (DPT) process, the DPT process at least partially etching the third insulating layer using first mask patterns and etching any remaining third insulating layer and the second insulating layer using second mask patterns, the second mask patterns being different from the first mask patterns;

growing a tunneling oxide layer on an active region defined as having a string structure by the field regions, where at least two strings are connected via one of the bridge regions;

forming a plurality of bit line contacts in the bridge regions; and forming a plurality of shared bit lines on the field regions in the first direction.

2. The method of claim 1, wherein the forming a plurality of field regions further comprises:

depositing a first oxide layer over the resultant structure;
performing planarization by chemical-mechanical polishing until the second insulating layer is exposed;
forming photo mask patterns on the first oxide layer;
forming a trench by etching the resultant structure using the second insulating layer and the photo mask patterns as a mask;
removing the photo mask patterns so as to obtain the bridge regions under the first oxide layer where the photo mask patterns have been removed; and
obtaining the field regions in the first direction by depositing a second oxide layer over the resultant structure and performing planarization by chemical-mechanical polishing until the second insulating layer is exposed,
wherein during the growing of the tunneling oxide layer, the first and second insulating layers are removed using the second oxide layer as a mask so as to expose the active region of the resultant structure, and growing the tunneling oxide layer on the active region.

3. The method of claim 1, wherein the double patterning technology (DPT) process comprises:

depositing a first poly silicon layer on the third insulating layer;

forming photo mask patterns on the first poly silicon layer;

etching the resultant structure using the photo mask patterns as the first mask patterns until a part of the third insulating layer is etched;

removing the photo mask patterns;

forming a medium temperature deposition of oxide (MTO) layer and a second poly silicon layer over the resultant structure;

removing part of the second poly silicon layer by etching-back;

etching the resultant structure using the remaining second poly silicon layer as the second mask patterns until the first insulating layer is exposed; and removing the remaining second poly silicon layer.

4. The method of claim 2, further comprising:

forming a plurality of word lines in a second direction perpendicular to the first direction across the upper parts of the active region and the field regions, wherein the photo mask patterns are arranged in the second direction either in a straight line or a zigzag fashion.

5. The method of claim 4, wherein each of the bit line contacts is extended to at least one of two adjacent sub regions.

6. The method of claim 5, wherein the active region in each of the bridge regions is convexly curved toward at least one of two adjacent first fields and two sub regions.

7. The method of claim 4, wherein the active region in each of the bridge regions is convexly curved toward at least one of two adjacent first fields and two sub regions.

8. The method of claim 2, wherein during the exposing of the active region of the resultant structure, the tunneling oxide layer is also grown in the bridge regions by removing the first insulating layer and the second oxide layer in the bridge regions.

9. The method of claim 1, wherein the first insulating layer is a pad oxide layer, the second insulating layer is a silicon nitride (SiN) layer, and the third insulating layer is a medium temperature oxide (MTO) layer.

10. The method of claim 1, wherein the forming of the plurality of bit line contacts comprises:

forming contact holes via which the active regions in the bridge regions are exposed, by etching the insulating layers formed on the bridge regions;

performing ion implantation in order to reduce contact resistance at the bottoms of the contact holes;

depositing a barrier metal layer along inner surfaces of the contact holes; and filling the resultant contact holes with a conductive material.

11. The method of claim 1, wherein the shared bit lines are formed by performing a copper damascene process.

12. The method of claim 1, wherein the DPT process comprises, patterning the third insulating layer using the first mask patterns, the first mask patterns formed on the third insulating layer and having a first etching selectivity with respect to the third insulating layer, depositing a fourth insulating layer and a material layer on the resultant structure, the material layer having a second etching selectivity with respect to the fourth insulating layer, removing a part of the material layer on the fourth insulating layer to form the second mask patterns between recessed portions of the fourth insulating layer, and etching the second insulating layer using the second mask patterns until the first insulating layer is exposed.

13. The method of claim 12, wherein the patterning of the third insulating layer using the first mask pattern comprises, depositing a first polysilicon layer on the third insulating layer, forming photo mask patterns on the first poly silicon layer, etching the resultant structure using the photo mask patterns as the first mask patterns until a part of the third insulating layer is etched, and removing the photo mask patterns.

14. The method of claim 12, wherein the material layer is a second polysilicon layer, the fourth insulating layer is a medium temperature oxide (MTO) layer, and the removing a part of the material layer includes removing the second polysilicon layer by etching-back.

15. The method of claim 12, further comprising:

removing the second mask patterns after the etching the second insulating layer.

* * * * *